United States Patent
Knizhnik et al.

(10) Patent No.: US 10,684,387 B2
(45) Date of Patent: Jun. 16, 2020

(54) LOGGING TOOL HAVING SIDE-LOOKING NUCLEAR MAGNETIC RESONANCE SENSOR

(71) Applicant: Weatherford Technology Holdings, Inc., Houston, TX (US)

(72) Inventors: Sergei Knizhnik, Exton, PA (US); Dmitry Avdeev, Exton, PA (US)

(73) Assignee: Weatherford Technology Holdings, LLC, Houston, TX (US)

( * ) Notice: Subject to any disclaimer, the term of this patent is extended or adjusted under 35 U.S.C. 154(b) by 30 days.

(21) Appl. No.: 15/759,481

(22) PCT Filed: Aug. 2, 2016

(86) PCT No.: PCT/US2016/045154
§ 371 (c)(1),
(2) Date: Mar. 12, 2018

(87) PCT Pub. No.: WO2017/052787
PCT Pub. Date: Mar. 30, 2017

(65) Prior Publication Data
US 2018/0252839 A1    Sep. 6, 2018

Related U.S. Application Data

(60) Provisional application No. 62/232,224, filed on Sep. 24, 2015.

(51) Int. Cl.
*G01V 3/32* (2006.01)
*E21B 49/00* (2006.01)
(Continued)

(52) U.S. Cl.
CPC .............. *G01V 3/32* (2013.01); *E21B 49/00* (2013.01); *G01R 33/383* (2013.01); *G01R 33/3808* (2013.01)

(58) Field of Classification Search
None
See application file for complete search history.

(56) References Cited

U.S. PATENT DOCUMENTS 3,250,986 A    5/1966    McKay
3,597,681 A    8/1971    Huckabay et al.
(Continued)

OTHER PUBLICATIONS

International search Report and Written Opinion in PCT/US2016/045154, dated Oct. 20, 2016.
(Continued)

*Primary Examiner* — Douglas X Rodriguez
(74) *Attorney, Agent, or Firm* — Blank Rome LLP

(57) ABSTRACT

Apparatus and methods are described for a side looking NMR tool for downhole geophysical analysis wherein a unique static field shape is provided by two magnets magnetized in two different directions. The tilted configuration of magnets and optimized value of the tilt angle provide, among other advantages, an elevation of the Signal-to-Noise-Ratio (SNR), an enriched content of the $^1$H NMR signal from rock formations by providing a wider span of gradients including higher gradients, a diminished level of undesired sodium $^{23}$Na signal, less tool energy consumption and a wider NMR beam.

20 Claims, 15 Drawing Sheets

(51) Int. Cl.
*G01R 33/38* (2006.01)
*G01R 33/383* (2006.01)

(56) References Cited

U.S. PATENT DOCUMENTS

| | | | |
|---|---|---|---|
| 4,350,955 | A | 9/1982 | Jackson et al. |
| 4,629,986 | A | 12/1986 | Clow et al. |
| 4,717,877 | A | 1/1988 | Taicher et al. |
| 5,055,787 | A | 10/1991 | Kleinberg et al. |
| 5,153,514 | A | 10/1992 | Griffin et al. |
| 5,488,342 | A | 1/1996 | Hanley |
| 5,646,528 | A | 7/1997 | Hanley |
| 5,712,566 | A | 1/1998 | Taicher et al. |
| 6,023,164 | A | 2/2000 | Prammer |
| 6,348,792 | B1 | 2/2002 | Beard et al. |
| 6,525,535 | B2 | 2/2003 | Reiderman et al. |
| 6,534,980 | B2 | 3/2003 | Toufaily et al. |
| 6,580,273 | B2 | 6/2003 | Reiderman |
| 8,115,481 | B2 | 2/2012 | Chen |
| 8,547,636 | B1 * | 10/2013 | Niessink ............ G02F 1/09 359/484.02 |
| 2002/0097051 | A1 | 7/2002 | Miller et al. |
| 2004/0066194 | A1 * | 4/2004 | Slade ............ G01R 33/3808 324/318 |
| 2004/0183538 | A1 | 9/2004 | Hanstein et al. |
| 2013/0093422 | A1 | 4/2013 | Morys et al. |
| 2018/0217214 | A1 * | 8/2018 | Li ............ G01V 3/32 |

OTHER PUBLICATIONS

Kenyon, Bill "Nuclear Magnetic Resonance Imaging—Technology for the 21st Century" Oilfield Review Autumn 1995.
Akkurt, R. et al. "Nuclear Magnetic Resonance Comes Out of Its Shell" Oilfield Review 20, No. 4 winter 2008/2009.

* cited by examiner

LOGGING TOOL HAVING SIDE-LOOKING NUCLEAR MAGNETIC RESONANCE SENSOR

CROSS REFERENCE TO RELATED APPLICATIONS

This application claims priority based on U.S. Provisional Application Ser. No. 62/232,224 filed Sep. 24, 2015, which is incorporated herein by reference in its entirety.

FIELD OF THE INVENTION

This invention relates generally to apparatus and methods for well logging using NMR sensors. The present invention relates more particularly to apparatus and methods for NMR well logging using side-looking sensors.

BACKGROUND OF THE INVENTION

Without limiting the scope of the invention, its background is described in connection with existing Nuclear Magnetic Resonance (NMR) based well logging tools with particular emphasis on wire-line NMR tools. Methods and apparatus that applied NMR to well logging were introduced over fifty years ago. See e.g. U.S. Pat. No. 3,250,986 (McKay). Traditionally NMR has been used to estimate the total pore volume (total porosity) of the source rock by measuring the amount of hydrogen present in the sample. The intensity of the NMR signal is proportional to the amount of hydrogen present in the sample. By calibrating the intensity of the resulting NMR signal to the signal intensity of known fluids, the porosity, permeability and movable fluid characterization of the system can be found.

An assembly of magnetic moments such as those of hydrogen nuclei will act like tiny bar magnets and will align along the direction of an applied magnetic field $B_0$ thus resulting in bulk magnetization of the affected hydrogen protons. The rate at which equilibrium is established in such bulk magnetization upon provision of the static magnetic field is characterized by the parameter $T_1$, the spin-lattice relaxation time or longitudinal magnetic relaxation. $T_1$ is affected by interactions between the resonating protons and their environment ("lattice") that allow the energy absorbed by the protons during resonance to be dispersed in the lattice. $T_1$ is dependent on molecular dynamics, which is in turn a function of molecular size and thus the viscosity of affected proton containing materials as well as their intermolecular interactions including with pore surfaces in the source rock. Therefore, water and different types of oil have different $T_1$ values. Heavy oils are characterized by $T_1$s in milliseconds while low-viscosity oils may have $T_1$s measured in seconds. These $T_1$ values may be shortened by interactions with pore surfaces thus providing information on pore-size distributions. The $T_1$ value in itself is obviously provides valuable information but a considerable amount of further information can be obtained by manipulating the spins of affected nuclei.

Early NMR tools used the Earth's magnetic field to align the hydrogen protons but such tools required doping of borehole mud fluids with magnetite to eliminate the NMR signal from the borehole itself. See e.g. Bill Kenyon et al., Nuclear Magnetic Resonance Imaging—Technology for the 21st Century, OILFIELD REV., Autumn 1995. In the early 1990's, Numar Corporation developed the first commercial pulsed NMR tool that included permanent, prepolarizing magnets and utilized radio frequency ("RF") pulses to manipulate the magnetic properties of hydrogen nuclei in formation fluids. See e.g. U.S. Pat. No. 4,717,877, Taicher et al.

Current standard NMR tools are able to provide quantification of important formation characteristics including porosity and saturation, which provide answers to the fluid volumetrics of the formation including the type and viscosity of included fluids and the pore distribution of the formation. Standard modern NMR tools are also able to quantitate the permeability of the formation, which assists in evaluation of the producibility of the formation. Advanced NMR tools are able to quantitate capillary pressure, wettability and surface tension, which also inform on the producibility of the formation and assist in aiding the design of completions. Because they are sourceless, NMR tools are considerably safer than tools that require nuclear radiation to evaluate formation characteristics.

Different formation characteristics are obtained from the relative values of the polarization times, relaxation times and magnetization amplitude. For example, the matrix independent Total Porosity is encoded in the fully polarized NMR amplitude whereas an approximation of permeability of formation can be derived from the rates of magnetization buildup and echo decays, which carry information about fluid interaction with the matrix, fluid type, diffusivity, and viscosity. With multi-frequency tools, basic diffusion based fluid typing can be accomplished. Multi-frequency tools allow measurements from different nuclei including sodium-23 ($^{23}$Na).

Important goals for any NMR tool are to obtain a relatively high signal-to-noise ratio ("SNR") and a maximum depth of investigation ("DOI"). The present invention satisfies these needs with a novel and unique geometry between the relative directions of the $B_0$ static magnetic field and the oscillating filed $B_1$.

BRIEF SUMMARY OF THE INVENTION

The present disclosure is directed methods and apparatus for an improved side looking NMR tool for downhole operations wherein the tool includes an NMR downhole tool sensor that features a pair of permanent magnets for generating a $B_0$ magnetization, wherein each of the pair of magnets has a different magnetization angle and the magnetization angles are non-parallel to each other. In certain embodiments, each of the pair of permanent magnets are identical in shape and are thus mirror images of each other. The sensor may include an RF antenna that includes an RF frame antenna and a pair of magnetically permeable antenna cores and the sensor further includes a high conductivity screen disposed between the permanent magnets and the pair of magnetically antenna cores such that RF magnetic fields generated by the sensor are shaped by the combined action of the magnetically permeable antenna cores and the high conductivity screen. The RF magnetic field generated is not substantially orthogonal to the direction of magnetization of either permanent magnet.

In certain embodiments, an NMR downhole sensor includes a pair of permanents magnets $M^1$ and $M^2$ and the magnetizations of each of satisfy:

$$M_x^1 = -M_x^2,\ M_y^1 = M_y^2,\ M_z^1 = M_z^2 = 0, \qquad \text{Eq. (2)}$$

where superscript (1) or (2) means the magnet number and where x and y are Cartesian space coordinates relative to a longitudinal axis of the permanent magnets, and the magnetizations are driven by a tilt angle:

$$^0\vartheta_{Tilt} = \frac{\pi}{2} - \operatorname{atan}\left(\frac{M_x}{M_y}\right). \quad \text{Eq. (3)}$$

In certain embodiments, the NMR sensor has a tilt angle $^0\vartheta_{Tilt}$ that is selected from a non-perpendicular $^0\vartheta_{Tilt}$ in a range from 75° and 105°, a range from 80° and 100°, a range of 92°-105° and a range of 75°-88°.

In certain embodiments the tilt angle $^0\vartheta_{Tilt}$ is an angle that is increased over perpendicular sufficiently to provide one or more of an increase a gradient and/or a signal to noise ratio over that achieved with a perpendicular direction of magnetization, a reduced power consumption of the sensor to under that required with a perpendicular direction of magnetization, and a decrease in a $^1$H borehole signal density to under that achieved with a perpendicular direction of magnetization.

In one embodiment disclosed herein, a side-looking NMR downhole tool is provided that includes an outer cylindrical housing adapted to eccentric placement in a borehole and having a front side that is adapted to closely approach and "look" toward a side of the borehole under investigation. The tool includes a centrally located internal backbone running axially through at least a portion of the housing. The backbone may be used as a mounting platform for elements of the sensor and in certain embodiments includes a central bore through which electric wires operating the tool are passed. Within the housing, a pair of mirror image elongated permanent magnets are disposed axially and affixed to the backbone on a side of tool that is distal to the front side of the housing, each of the pair of permanent magnets having a different and non-parallel magnetization angles that are perpendicular to a longitudinal axis of the housing. In certain embodiments the magnets are segmented thus permitting some flexibility to the tool without risk of breaking the magnets. Also included in the housing is an RF antenna that is formed of an RF frame antenna and a pair of magnetically permeable antenna cores. The antenna may be affixed to the central backbone and is disposed on a side of tool that is proximal to the front side of the housing. A high conductivity screen is disposed between the permanent magnets and the pair of magnetically permeable antenna cores, and the RF magnetic field generated by the sensor is shaped by the combined action of the magnetically permeable antenna cores and the high conductivity screen. The RF magnetic field generated by the tool sensor is not substantially orthogonal to the direction of magnetization of either permanent magnet.

The apparatus disclosed herein is suitable for generating NMR data having an improved SNR and an increase in gradients from which formation information is obtained.

BRIEF DESCRIPTION OF THE DRAWINGS

For a more complete understanding of the present invention, including features and advantages, reference is now made to the detailed description of the invention along with the accompanying figures:

FIG. 7A depicts the SNR. FIG. 7B depicts the $^1$H borehole and $^{23}$Na borehole signals. FIG. 7C depicts the antenna operating frequency. FIG. 7D depicts the gradient of weight by signal.

DETAILED DESCRIPTION OF THE INVENTION

Disclosed herein is a unique and novel design of a wireline side-looking NMR tool that, among other advantages, provides for an improved static field shape. This static field shape is provided by two magnets magnetized in two different directions relative to their longitudinal axis. As disclosed herein, the tilted configuration of magnets and optimized value of the tilt angle provides an elevation of the Signal-to-Noise-Ratio (SNR), an enriched content of the $^1$H NMR signal from rock formations by providing a wider span of gradients including higher gradients, a diminished level of undesired sodium $^{23}$Na signal, less tool energy consumption and a wider NMR beam.

While the making and using of various embodiments of the present invention are discussed in detail below, it should be appreciated that the present invention provides many applicable inventive concepts which can be employed in a wide variety of specific contexts. The specific embodiment discussed herein are merely illustrative of specific ways to make and use the invention and do not delimit the scope of the invention.

Figure 1:
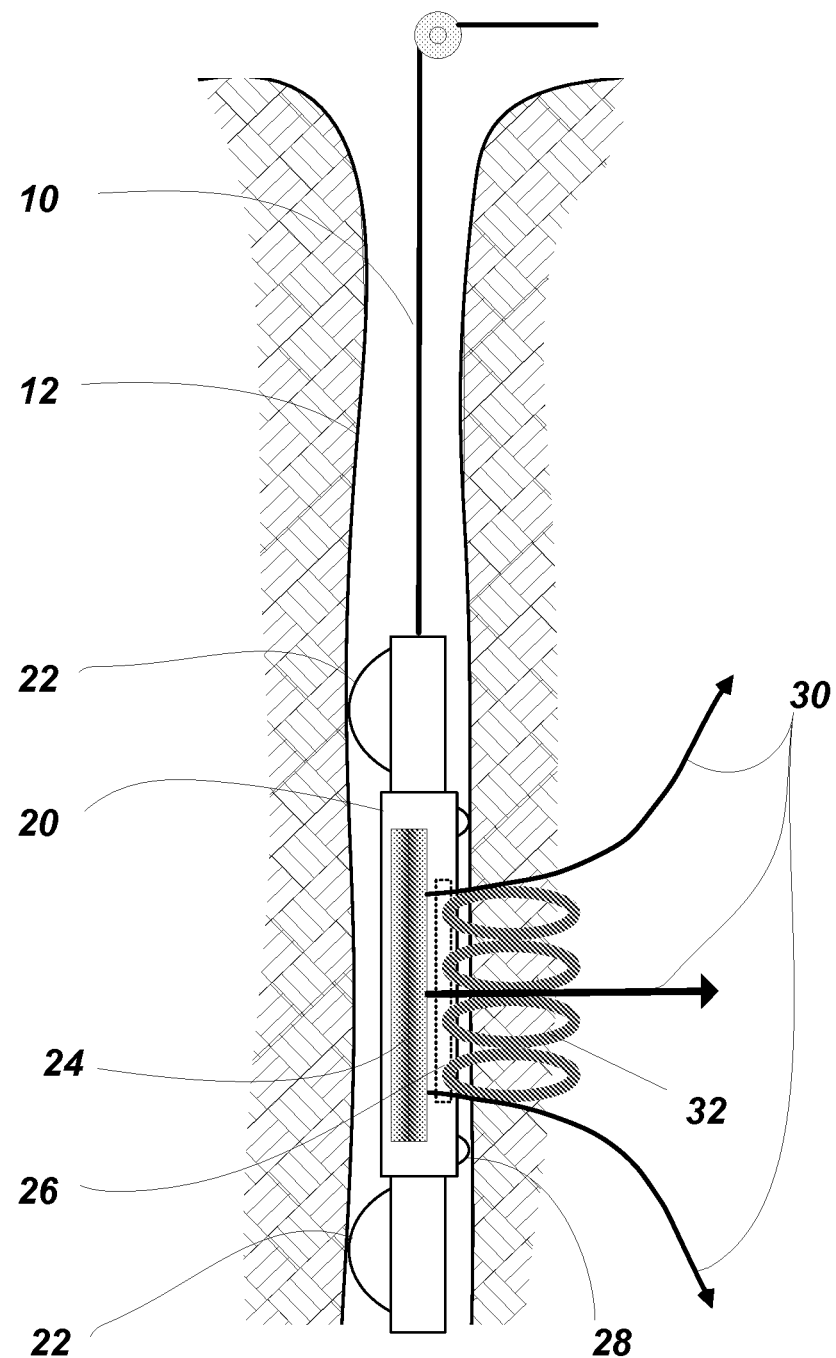
FIG. 1 graphically depicts a side looking NMR tool disposed on wireline in a borehole.

ABBREVIATIONS $B_0$=static magnetic field, gauss
$B_1$=amplitude of the oscillating magnetic field perpendicular to $B_0$, gauss
$M_0$=macroscopic magnetization, gauss/cm$^3$
$M_{0x}$=magnitude of the transverse magnetization at t=0, gauss/cm$^3$
$M_x(t)$=transverse magnetization at time t, gauss/cm$^3$ $M_z(t)$=longitudinal magnetization at time t, gauss/cm$^3$
t=time, seconds
x, y, z=Cartesian space coordinates
$T_1$=longitudinal relaxation time, seconds
$T_2$=transverse relaxation time, seconds
$T_E$s=interecho spacing, seconds
$T_W$=polarization (wait) time, seconds Typical "side-looking" NMR tools such as that depicted in FIG. 1 involve pressing the NMR tool housing 20 against a sidewall of the borehole 12 via mechanisms such as bowsprings 22. The tool housing 20 is typically held at a uniform close distance from one side of borehole 12 via standoff spacers 28. Spacers 28 and bowsprings 22 help compensate for the rugosity of the borehole while keeping the tool "faced" closely to the side of the borehole under investigation and thus "looking" in such direction. NMR tools have historically utilized one or more magnets 24 arrayed along a longitudinal axis that generated a static magnetic field having a static field direction substantially perpendicular (90°) to the longitudinal axis and having generally uniform amplitude along the azimuth with respect to the longitudinal axis in the remote region under examination. As the tool is moved through the borehole (usually as the tool is pulled upward), the tool magnets apply a strong static magnetic field $B_0$ (depicted as arrows 30) that gradually align the spins or magnetic moments of hydrogen protons in oil, gas and brine fluids in the area of investigation to that of the direction of the static magnetic field of the magnets resulting in macroscopic magnetization of these protons.

NMR tools will further include an RF "probe" or "antenna" 26 for generating an RF magnetic field or pulse 32 (also called an oscillating field or the $B_1$ field) in the remote region under investigation that is substantially perpendicular to both the longitudinal axis of the magnets and to the static field direction. Thus, according to modern practice when using such tools, after some level of magnetization is achieved, a short high power (tens of kW peak power, >1,000V in amplitude) RF pulse is generated to influence the induced polarization of the hydrogen protons. This RF pulse is termed $B_1$. The timing, amplitude and frequency of $B_1$ is selected to tip the proton magnetization of the hydrogen protons by 90 degrees ($\pi/2$) in the selected sensitive volume under investigation. Immediately after $\pi/2$ pulse is completed, the proton spins are still coherent and a small (nV level) signal can be observed in the antenna. This so-called "free-induction decay" is masked by powerful ring-down and is not used in downhole tools. Next, a further short high power RF pulse is generated with the timing, amplitude and frequency selected to tip the hydrogen proton magnetization by 180 degrees ($\pi$) in the selected Sensitive Volume under investigation. This $\pi$ pulse starts the refocusing process of the affected protons. Sometime after $\pi$ pulse completion, the spins of the affected protons regain coherency and a small RF signal is detected by the antenna and recorded. Refocusing using additional pulses and detection of the induced RF signal is repeated at a set pulse spacing time ($T_E$) until no more signal is present.

A common sequence of excitation pulse followed by a train of refocussing pulses utilized in well logging is the Carr-Purcell-Meiboom-Gill ("CPMG") sequence. The NMR signal between each pair of consecutive pulses is called an echo that is characterized by a maximum at the midpoint between pulses followed by a decay before the next pulse. The rate of decay of the amplitude of the NMR signal is reflected in a distribution of decay times, called transverse relaxation times or $T_2$s. Thousands of echoes may be induced and recorded over a period of about a second. The amplitudes of the echoes are proportional to the net magnetization in the transverse plane (relative to the static magnetic field) and it is the decay in amplitudes over the course of the measurement that is particularly informative.

Figure 2:
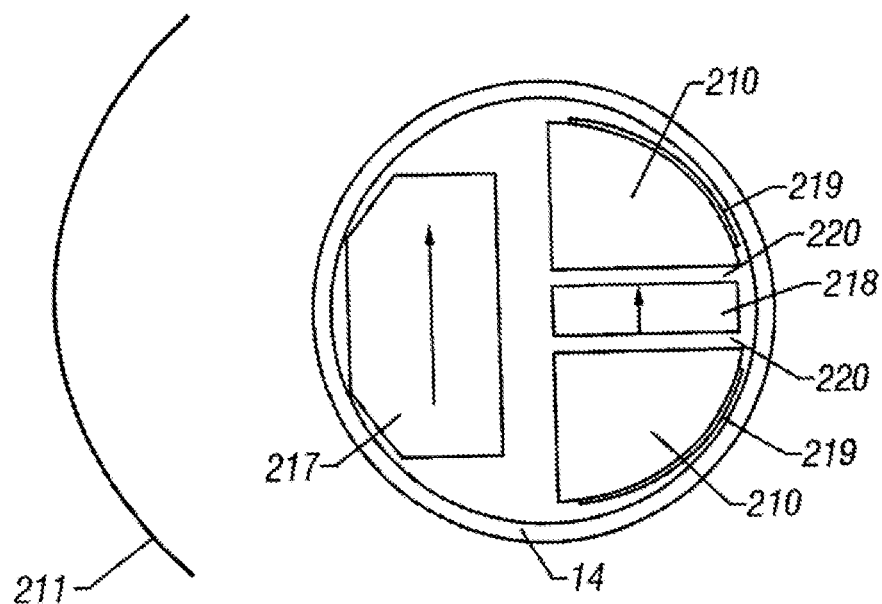
FIG. 2 depicts a prior art magnet arrangement in a side looking NMR tool.
Figure 3:
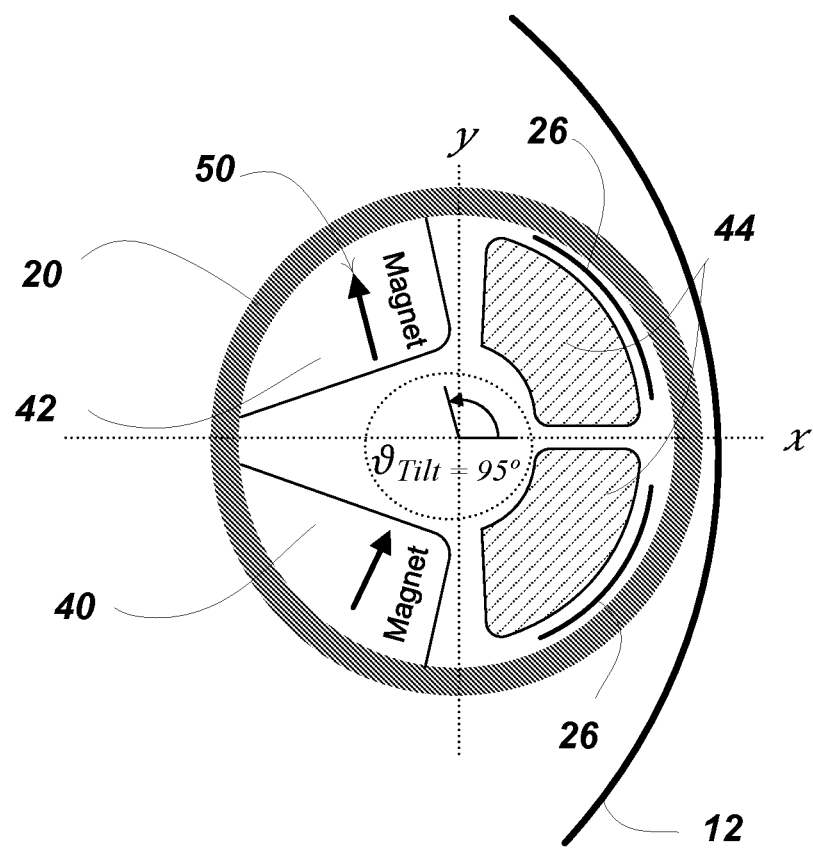
FIG. 3 depicts an embodiment of tilted magnets in an NMR tool according to an embodiment of the invention.

In order to accomplish the 90 and 180 degree tipping of proton spins, current NMR tool designs utilize either a single magnet or plurality of permanent magnets for generation of the static magnetic field. Whether utilizing a single or plurality of magnets, in prior art designs such as that exemplified by that in U.S. Pat. No. 6,348,792 (Beard) and U.S. Pat. No. 6,580,273 (Reiderman), the permanent magnet is magnetized in a single direction that is essentially perpendicular (90°) to the longitudinal axis of the magnet. If a plurality of magnets are used such as depicted in FIG. 3 of U.S. Pat. No. 6,348,792 (reproduced herein as FIG. 2 (Prior Art)), the magnets will have parallel magnetization in the same direction as depicted by the arrows in FIG. 2. Prior art designs, such as that disclosed in FIG. 3 of U.S. Pat. No. 6,348,792 (reproduced herein as FIG. 2 (Prior Art)), typically include an RF dipole antenna including the depicted wires 219 and core 210 for inducing an RF magnetic field orthogonal to the direction of magnetization of the static field inducing permanent magnets shown as 217 for the main magnet and 218 for the secondary magnet in FIG. 2 (Prior art).

The sensor section of prior art NMR tools typically includes a permanent magnet assembly and an RF antenna with its core along with some structural members. In one embodiment provided herein and as depicted in FIG. 3, the NMR sensor includes two mirror image pieces of permanent magnets 40 and 42, RF frame antenna 26 in close proximity to the two soft-magnetic antenna cores 44. The static magnetic field is created by the pair of magnets 40 and 42 that have their magnetizations tilted one with respect to another (=non-parallel magnetizations). In the depicted embodiment, the tilt angle ($°\vartheta_{Tilt}$) 50 is 95° from the x axis. The present inventors have discovered that a proper choice of the tilt angle delivers improved SNR and a wider span of the static field gradient. These improved qualities are beneficial for a more accurate interpretation of NMR measurements.

Figure 4A:
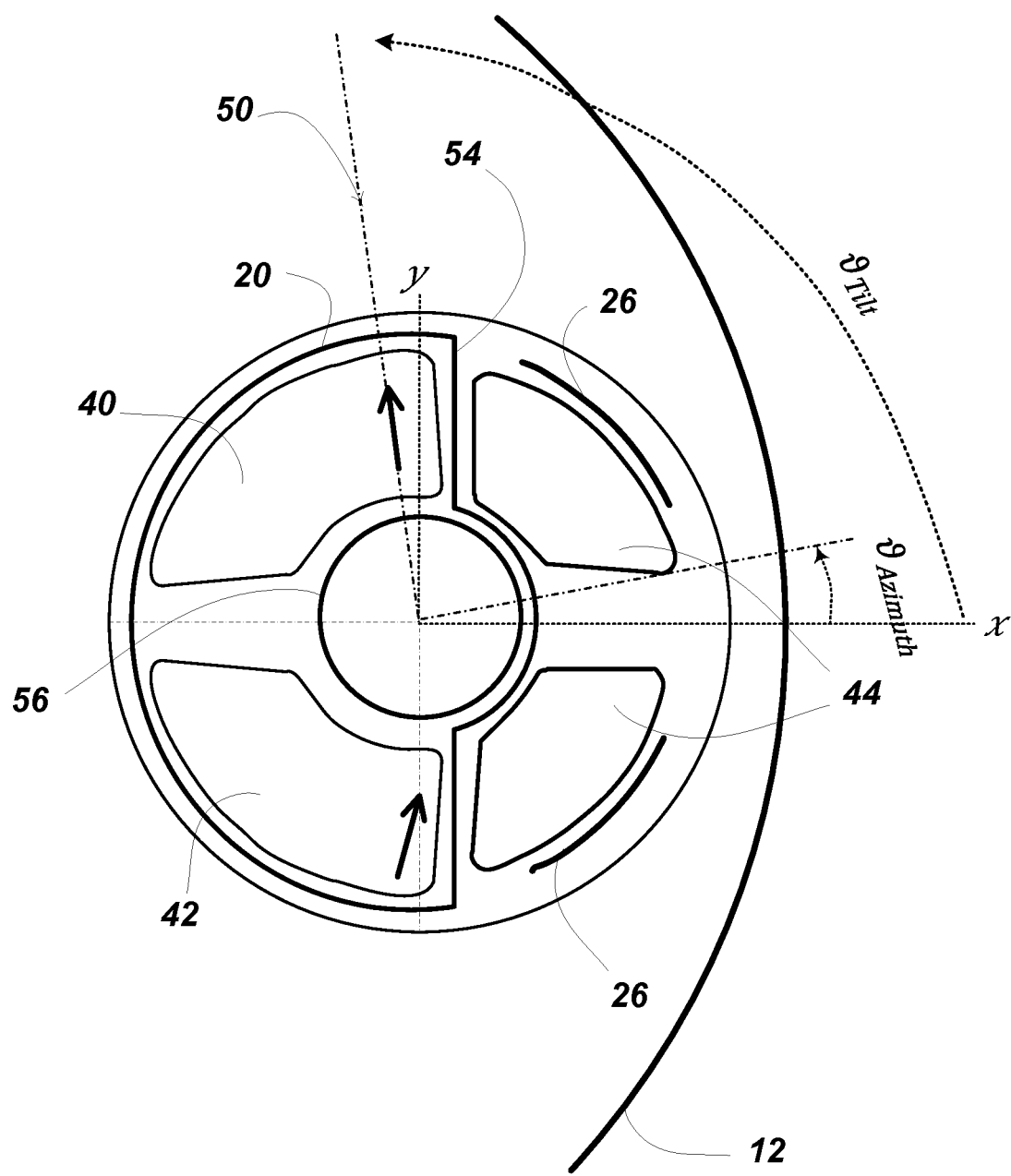
FIG. 4A illustrates a cross-sectional (x-y) view of a side-looking NMR logging tool that is perpendicular to the axis of the borehole according to one embodiment.

Thus, in contrast to prior art designs, the present disclosure provides a unique magnet arrangement for generating the static magnetic field. As depicted schematically in FIG. 4A, the tool is a side looking NMR tool and tool housing 20 is closely opposed to one side of borehole 12. In the depicted embodiment, the housing 20 encloses two essentially mirror image magnets 40 and 42 that are utilized for generating the static magnetic field and each is magnetized in a direction perpendicular to the longitudinal axis of each magnet. However, the magnetization direction of magnet 40 is different from that of magnet 42 and the directions of magnetization are non-parallel. Further, in the depicted embodiment, the RF magnetic field is not formed through the use of an RF dipole antenna but is shaped via magnetically permeable antenna core elements 44 and high conductivity screen 54 that is positioned between cores 44 and magnets 40 and 42. In the depicted embodiment, high conductivity screen 54 essentially encircles magnets 40 and 42. Both the antenna and screen are formed of high electrical conductivity materials examples of which include copper, aluminum, and silver. In one embodiment, screen 54 is copper.

In contrast to prior art designs, in the embodiments disclosed herein, the RF magnetic field is not substantially orthogonal to the direction of magnetization of either permanent magnet. Thus there is no single magnetization in this approach. Through the use of this configuration, an optimal static field shape is obtained, which is adjustable by controlling the relative angle between the magnetization directions of magnets 40 and 42.

Figure 10:
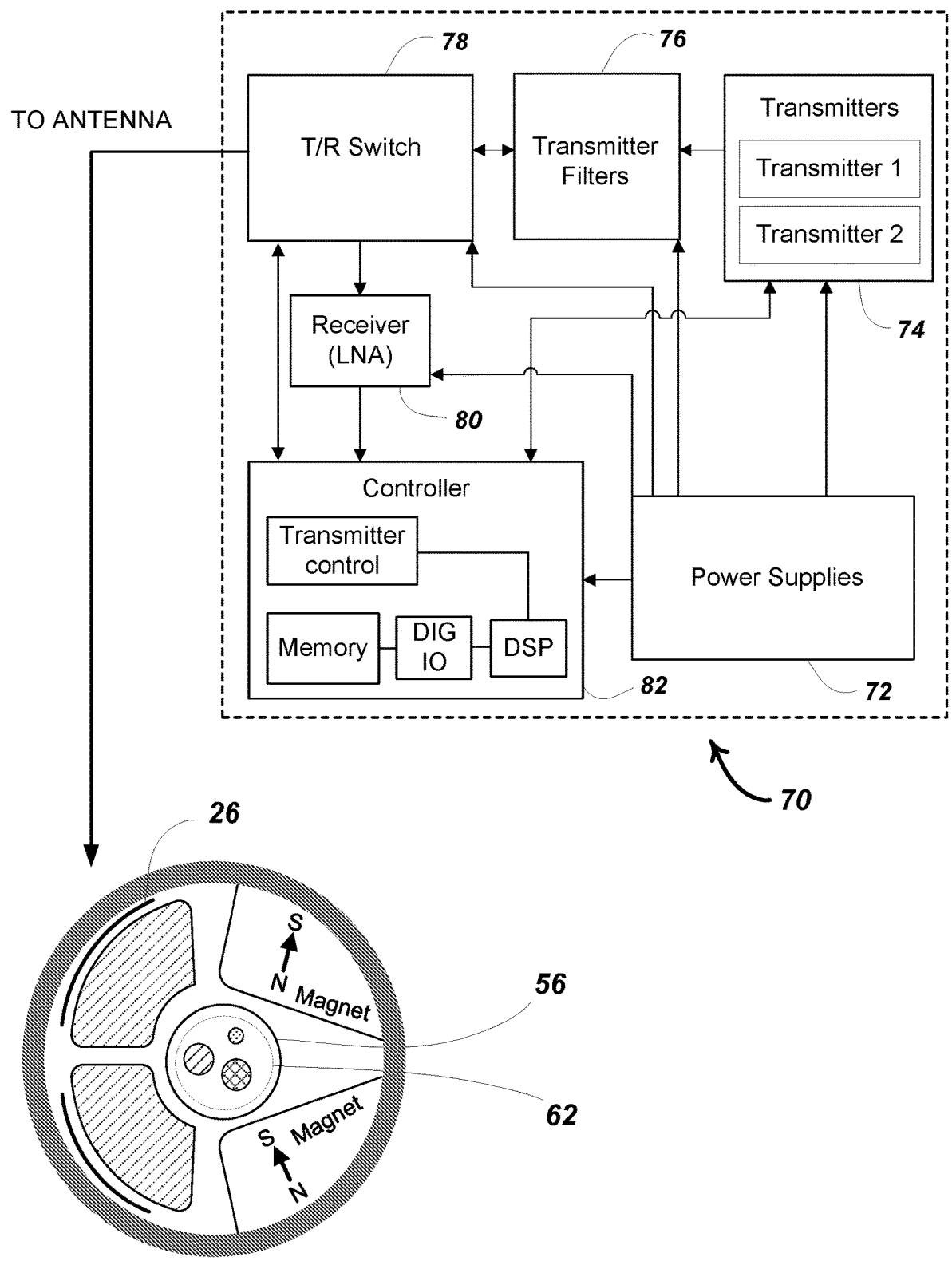
FIG. 10 depicts diagram of certain tool components and electronics according to one embodiment.

Referring again to FIG. 4A, showing tool housing 20 closely opposed to borehole 12. The tool is a side-looking NMR downhole tool where the outer cylindrical tool housing 20 is adapted to eccentric placement to one side of the borehole 12 and having a front side that is adapted to closely approach a side of the borehole and "look" sidewise from the borehole into an area of the formation under investigation. Housing 20 is typically made of an RF-transparent material, e.g. fiberglass, plastic, or ceramic. Housing 20 encloses the sensor's key components including magnets 40 and 42, antenna strips 26 and antenna core 44, and shield 54. The antenna strips run longitudinally in front of the ferrites or antenna cores 44 along the front of the tool body that faces a signal collection zone in the area of investigation in the formation. An additional advantage to the depicted embodiment is a design with the magnet and antenna cores are split in two pieces and configured around an internal structural backbone member 56 that passes axially thru at least a portion of the housing in a generally central portion of the housing. The backbone offers a mounting platform for sensor components if desired and maybe of a number of configurations including a round post or with a more complex cross-sectional area. As depicted in FIG. 10, backbone member 56 may be used as a conduit for one or more electrical wires 62.

As depicted, a pair of mirror image elongated permanent magnets 40 and 42 are dimensioned to be disposed axially within the housing and affixed to the backbone on a side of tool that is distal to the front side of the housing, each of the pair of permanent magnets having a different and non-parallel magnetization angles that are perpendicular to a longitudinal axis of the housing. The non-parallel orientation of the magnet blocks offer yet another degree of freedom to the actual mechanical design. As shown on FIG. 4A, the RF antenna comprising an RF frame antenna and a pair of magnetically permeable antenna cores is affixed to the backbone on a side of tool that is proximal to the front side of the housing, that is, the side under investigation. A high conductivity screen is disposed between the permanent magnets and the pair of magnetically permeable antenna cores and the RF magnetic field generated by the sensor is shaped by the magnetically permeable antenna cores and the high conductivity screen.

Figure 4B:
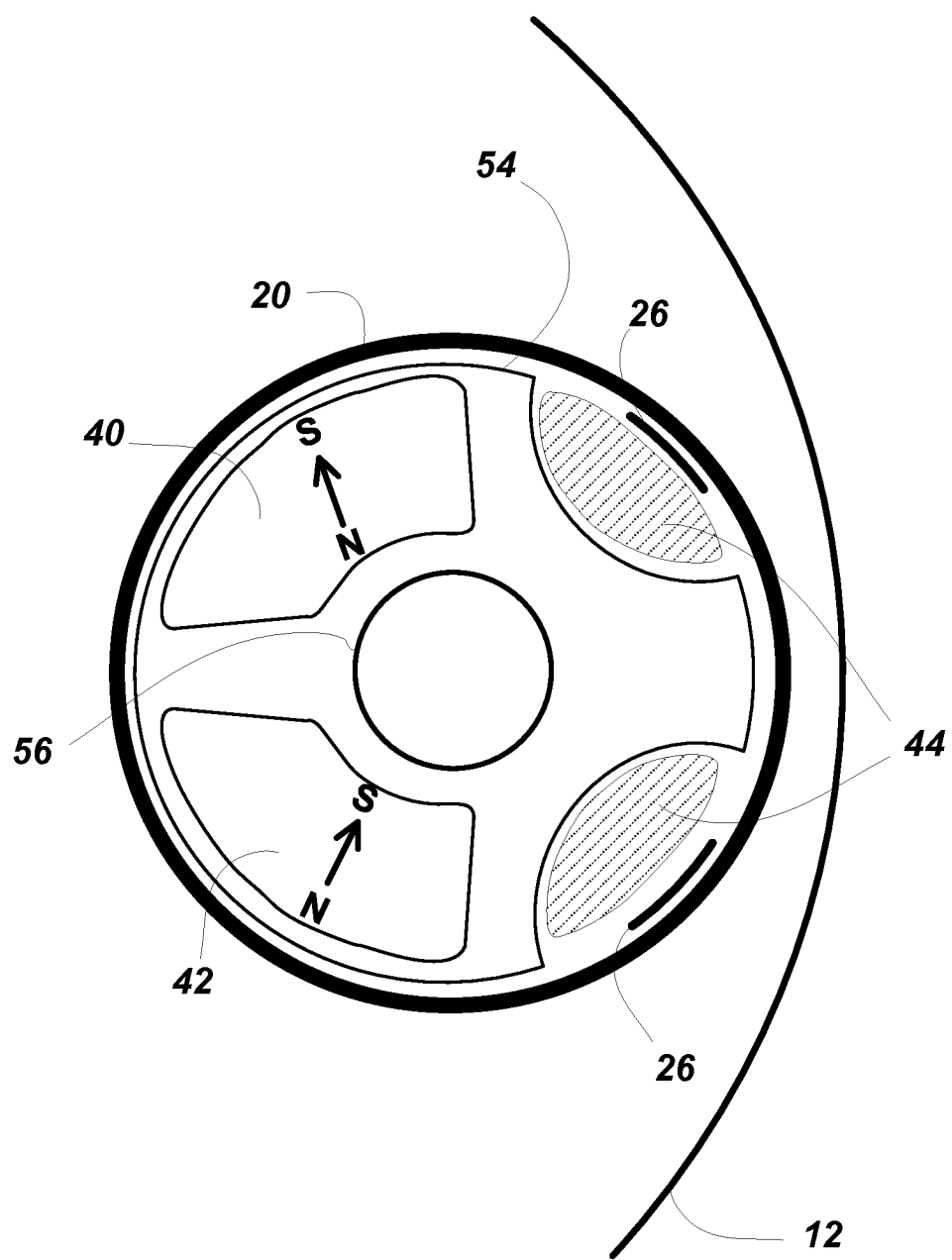
FIG. 4B illustrates a cross-sectional (x-y) view of another embodiment of a side-looking NMR logging tool that is perpendicular to the axis of the borehole.

In FIG. 4B, the north and south poles of the permanent magnets are shown. In certain embodiments, the longitudinal magnets 40 and 42 are segmented to allow flexibility to the tool.

Typically, the same antenna is utilized to transmit RF pulses and to receive NMR echoes. To this end, via a transmit/receive (T/R) switch, the antenna sequentially gets connected to either transmitter or receiver of the apparatus. In the course of a sequence of RF pulses, the sensor creates, in front of RF antenna strips 26, a thin resonant shell (Sensitive Volume) from which it receives the echoes. The shell thickness is on the order of 1 mm. The echoes are generated by resonating fluid(s) protons and constitute the so-called echo-train. Both the shape of the Sensitive Volume and depth-of-investigation (DOI) depend on (a) the shape and intensity of magnetic field, $B_0$, created by the permanent magnets ($B_0$-system), and (b) on the shape and configuration of the antenna and core, and the operating frequency f of the RF antenna ($B_1$-system).

Theoretically, there exists a bit simplistic but valid relation:

$$f = \frac{\gamma}{2\pi} B_0 \qquad \text{Eq. (1)}$$

that allows finding the geometrical shape of the sensitive volume. However, signals coming from various parts of the Sensitive Volume potentially have different intensity, and accurate calculation of the signals may require some complicated numerical modeling.

FIG. 4 shows a cross-sectional x-y view of an embodiment of a side-looking NMR logging tool that is perpendicular to the axis of the borehole. The permanent magnets 40 and 42, cores 44 and RF antenna 26 along with the coordinate system are shown. The tilted arrows represent the magnetization $\overline{M}=(M_x, M_y, 0)$ directions.

Taking the example of an exemplary side-looking tool shown in FIG. 4, the $B_0$-system of the tool has two permanent magnets of the same geometry but each with specifically oriented magnetizations. More exactly, the magnetizations must satisfy:

$$M_x^1 = -M_x^2, \ M_y^1 = M_y^2, \ M_z^1 = M_z^2 = 0, \qquad \text{Eq. (2)}$$

where superscript (1) or (2) means the magnet number. Thus referring to FIG. 4, $M^1$ could be considered magnet 40 and $M^2$ could be considered magnet 42. The magnetizations are driven by the tilt angle:

$$°\vartheta_{Tilt} = \frac{\pi}{2} - \mathrm{atan}\left(\frac{M_x}{M_y}\right). \qquad \text{Eq. (3)}$$

In what follows, it is demonstrated that tuning the tilt angle $°\vartheta_{Tilt}$ delivers certain enhancements to the tool performance. Numerical simulation were performed of key NMR-related parameters (such as Signal-to-Noise Ratio (SNR), span of gradients, tool power consumption among others). The magnetization tilt angle, $°\vartheta_{Tilt}$, of the magnets were varied in order to optimize performance of the entire system. In one simulation, four (4) depths of investigation (DOI) were considered: 1, 2, 3 and 4 inches from the borehole wall. The tool offset was chosen as 0.5 inch. These distances were taken along the X-axis.

Figure 5A:
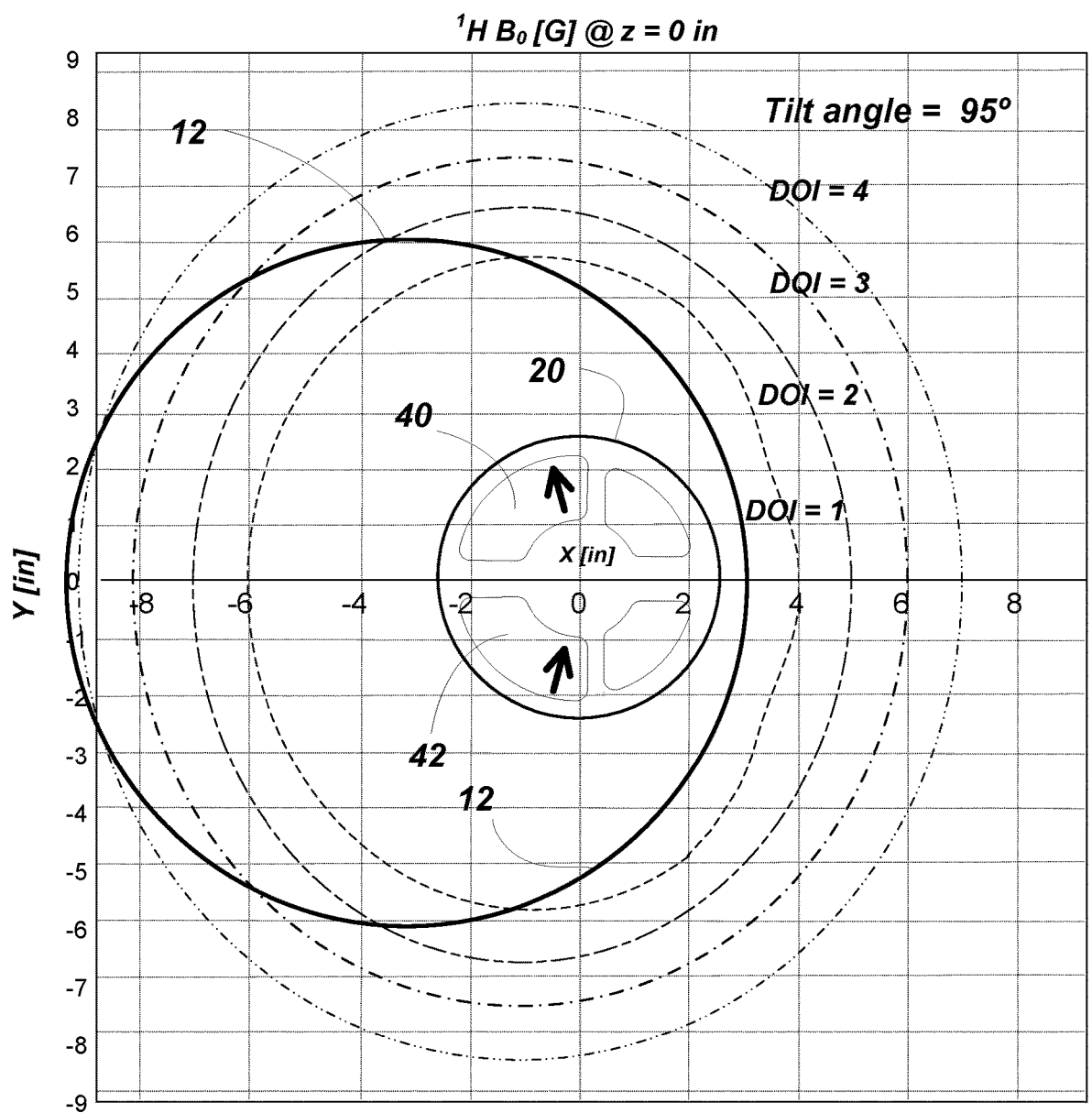
FIG. 5A shows Sensitive Volumes as isolines of $B_0$ in Gauss [G] at 1, 2, 3 and 4 depths of investigation (DOI) shown for a $^0\vartheta_{Tilt}$ of 90°.
Figure 5B:
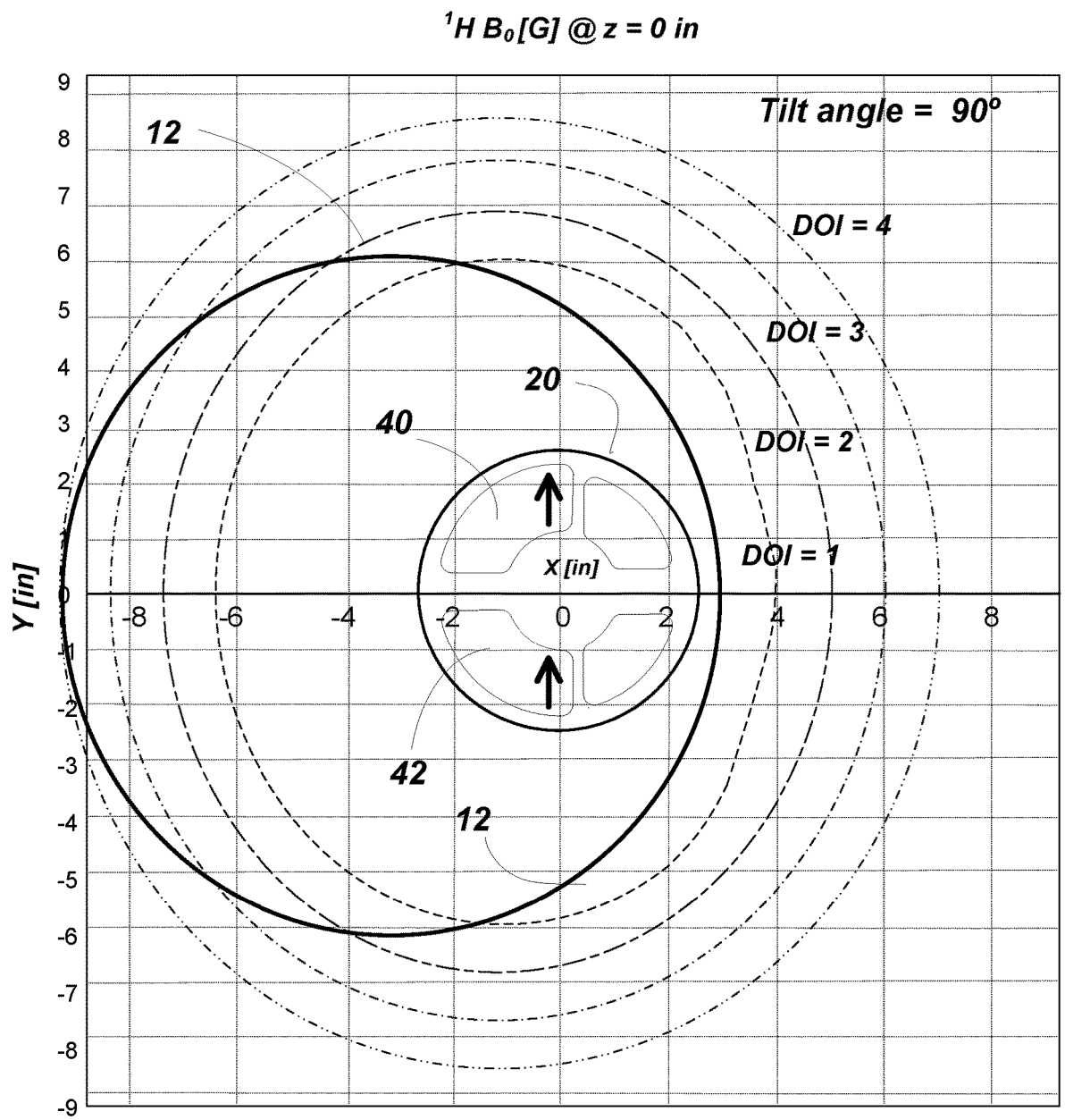
FIG. 5B shows Sensitive Volumes as isolines of $B_0$ in Gauss [G] at 1, 2, 3 and 4 DOI shown for a $^0\vartheta_{Tilt}$ of 95°.
Figure 5C:
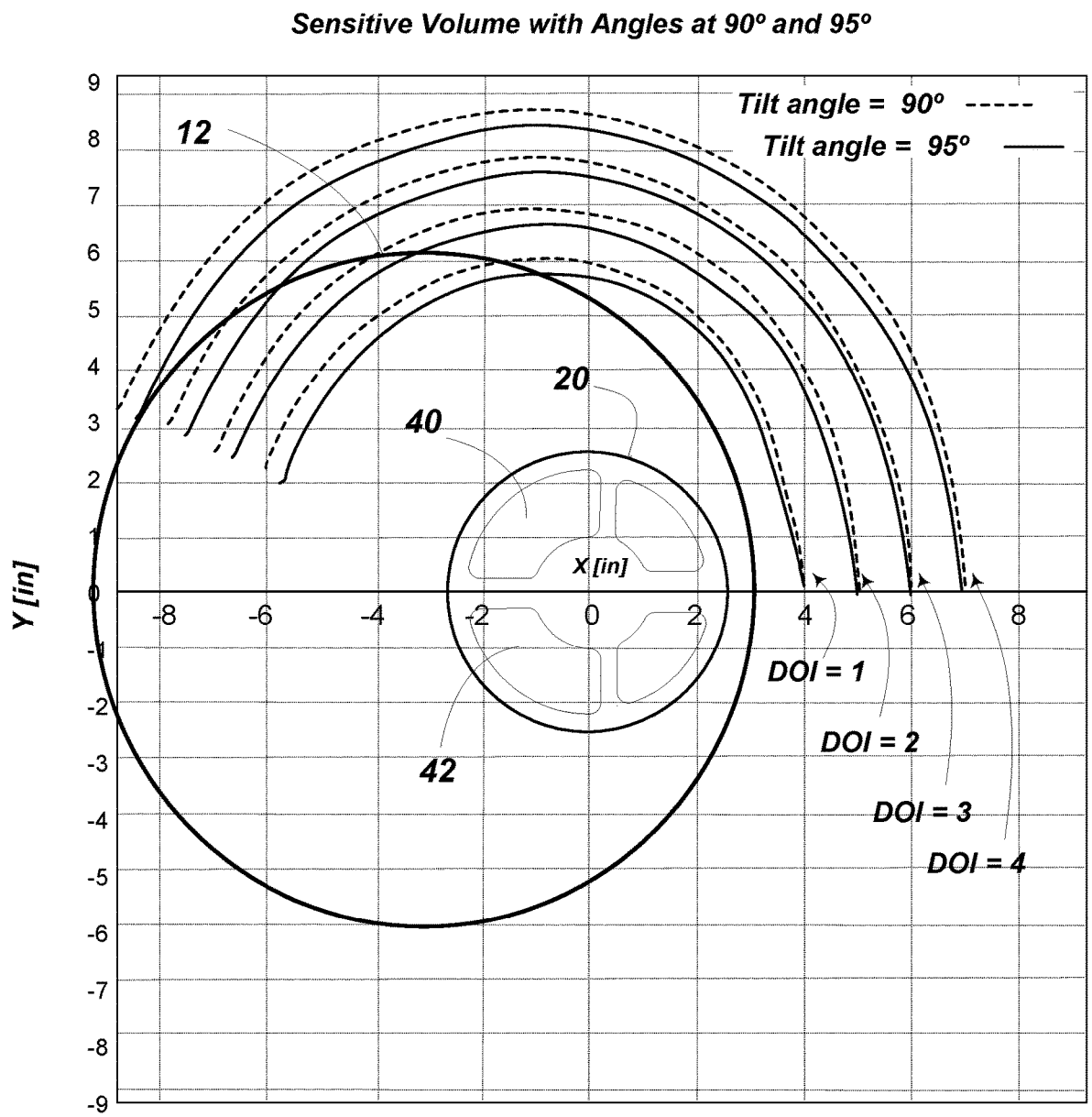
FIG. 5C shows an overlay comparing the Sensitive Volumes at tilt angles 90° and 95°. In each of FIGS. 5A-C the isolines of G are relative to a horizontal cut through the center of antenna (it is assumed that tool is vertical and thus z=0 along the tool axis).

If the tool operates on several frequencies, it creates several Sensitive Volumes, each at its own depth of investigation (see FIGS. 5A and 5B). FIGS. 5A, B and C show the respective Sensitive Volumes at 1, 2, 3 and 4 DOI for two exemplary tilt angles, $°\vartheta_{Tilt}$, of 90° and 95° (the 12.25-in borehole is also shown as the inner round circle 12). As the tilt of the magnet magnetization changes, the $B_0$ field direction, its intensity and gradient change as well. Thus, the tilt provides an additional degree of freedom for the adjustment system's parameters. As shown in the overlay of FIG. 5C, at every level of the Sensitive Volumes (reflected in the DOI), directions, intensities, and gradients of the $B_0$ field are slightly different, which result in the variations of different key parameters shown in FIGS. 7-9.

Figure 6:
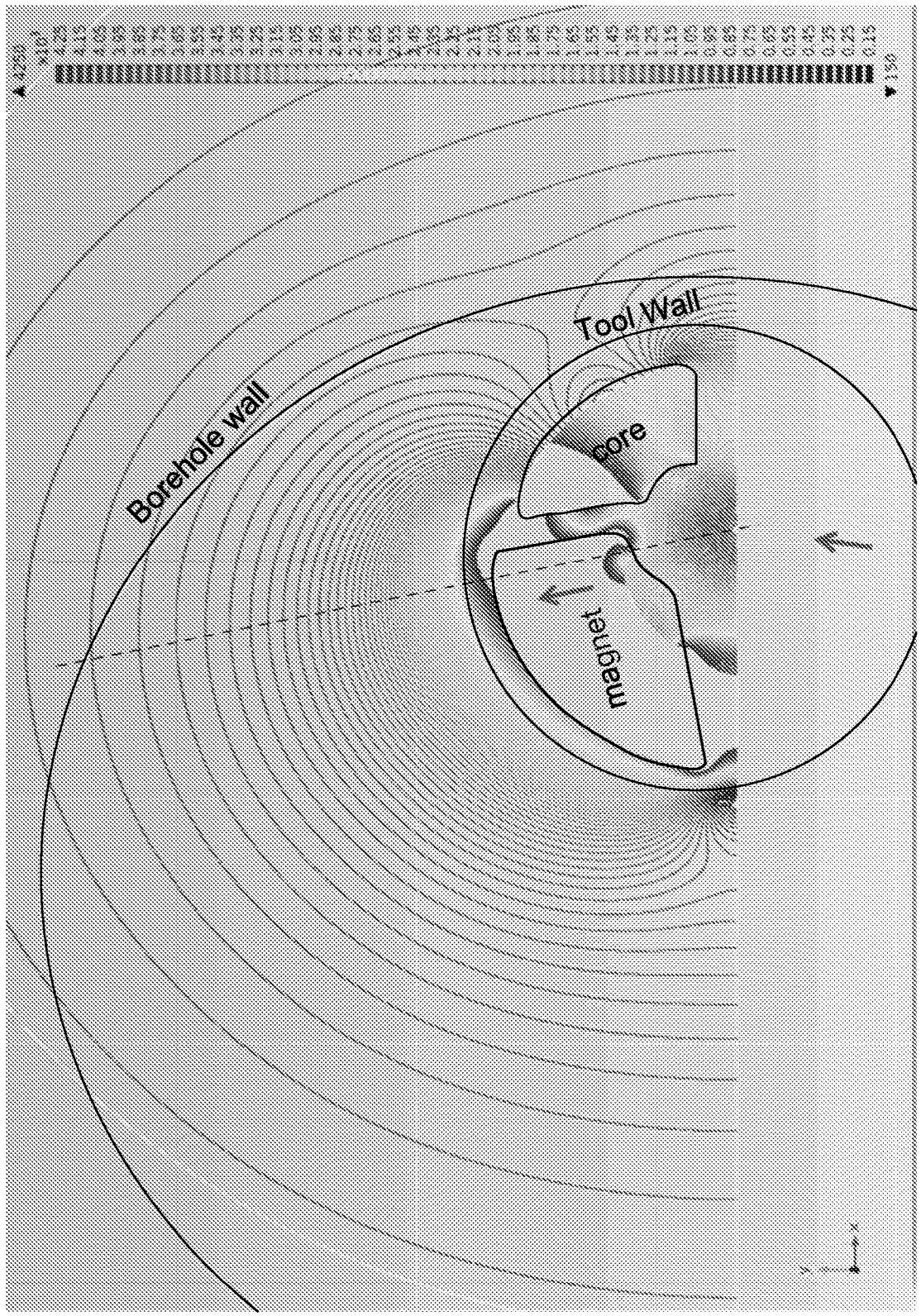
FIG. 6 illustrates an exemplary magnetic field $B_0$ flux (for simplifying the illustration, only one half is shown) according to one embodiment.

An example of the $B_0$ flux for a tilted magnet showing the $B_0$-system ($°\vartheta_{Tilt}=100°$) is plotted in FIG. 6 (showing only half of the resulting fields). In this example, with alteration of the tilt angle, $°\vartheta_{Tilt}$, the $B_0$-system is altered and, hence, the $B_0$ field value at the fixed DOI is also changed. This in its turn, as it follows from Eq. (1), brings an alteration of the operating frequency f of $B_1$-system.

The system using tilted magnets was found to a) maximize SNR, and b) maximize the gradient content of the $^1$H NMR signal by utilizing higher gradients. The latter factor is paramount for any post-processing $T_2$-D° inversion, which should transform the echo-trains logged by the tool into a set of $T_2$-D° maps. These maps are then interpreted in terms of the relevant petrophysical properties. The more gradients present within the Sensitive Volume, the better any inversion resolves the formation diffusivity, D. Indeed, the Bloch-equation shows that the gradients influence the echo-train as:

$$\text{Signal}(t) \propto e^{-\alpha D G^2 t} \qquad \text{Eq. (4)}$$

In particular, Eq. (4) shows that the larger gradient G allows finding the smaller diffusivity coefficient, D. This is of importance in many practical cases (i.e. in rock formations with heavy oil components). And, of course, the larger SNR the faster logging speed of the tool. This is why it is important to maximize SNR of wireline NMR tools.

Figure 7A:
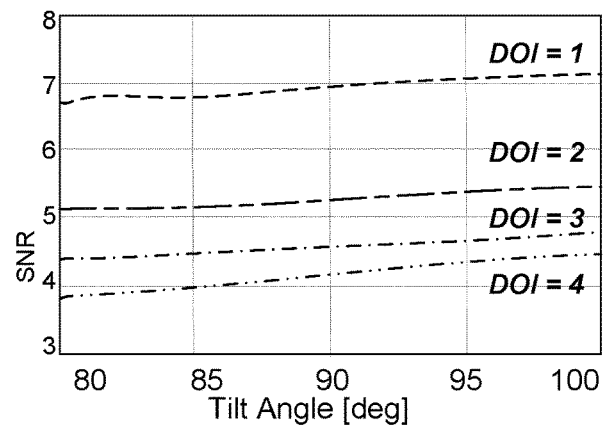
FIGS. 7A-D illustrate certain operating features or received data as a function of the tilt angle of the magnets.
Figure 7B:
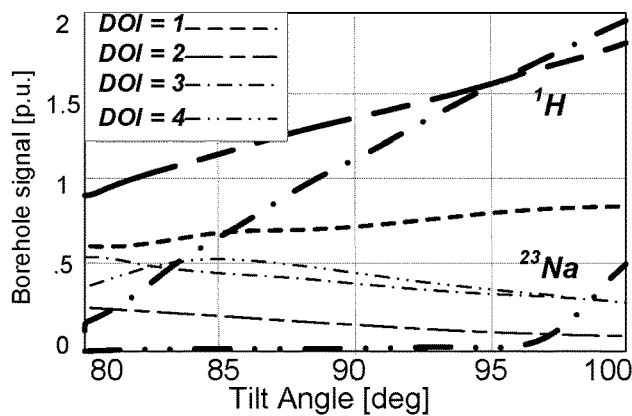
Figure 7C:
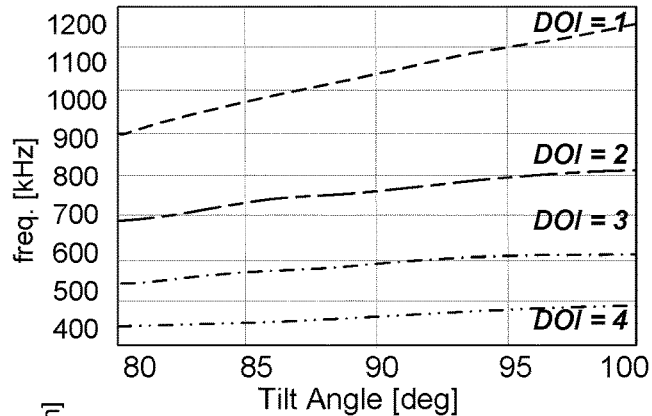
Figure 7D:
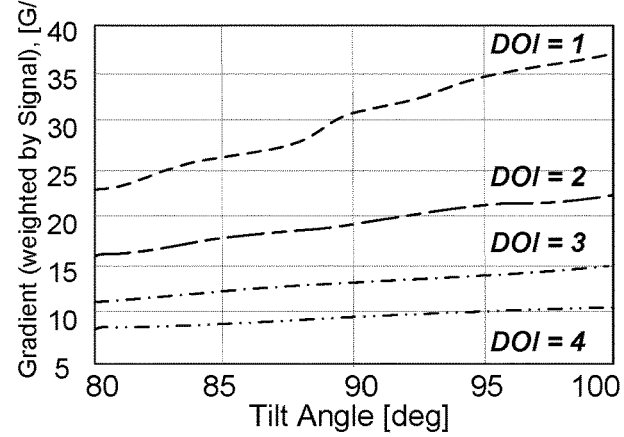

Also from FIGS. 5A and B, it is also seen where each Sensitive Volume penetrates into borehole. Signals from parts that lie within the borehole are unwanted, since they do not bring any information about rock formations, and only serve distort useful signals. As a practical matter however, unwanted borehole signals at levels of a few porosity units [p.u.] are considered to be acceptable for most NMR applications. The undesired $^1$H borehole signals (for various DOI) as a function of the tilt angle $°\vartheta_{Tilt}$, are presented in FIG. 7B. To calculate the signals, a 12.25-in OD borehole was simulated with a 5 inch O.D. tool and a tool offset of 0.5 in. A rectangular pulse was applied. The antenna quality factor [Qvac] was 120 and the Noise Factor [NF]=1 dB. As seen from FIG. 7B, the $^1$H borehole signals (heavy lines) increase when the tilt angle increases. Obviously, the larger borehole OD delivers the larger borehole $^1$H signals. In the same figure the $^{23}$Na (sodium) borehole signals are shown in light lines. In a salty environment, there is a possibility of mixing those signals with $^1$H signals from protons. The simulation demonstrates that $^{23}$Na signals are dropped with an increase of the tilt angle. FIG. 7A shows the SNR curves, whereas FIG. 7D presents the gradients G at various DOI as a function of the tilt angle. One can see that with increase of tilt angle, both the SNR and the gradient span increase.

Figure 9A:
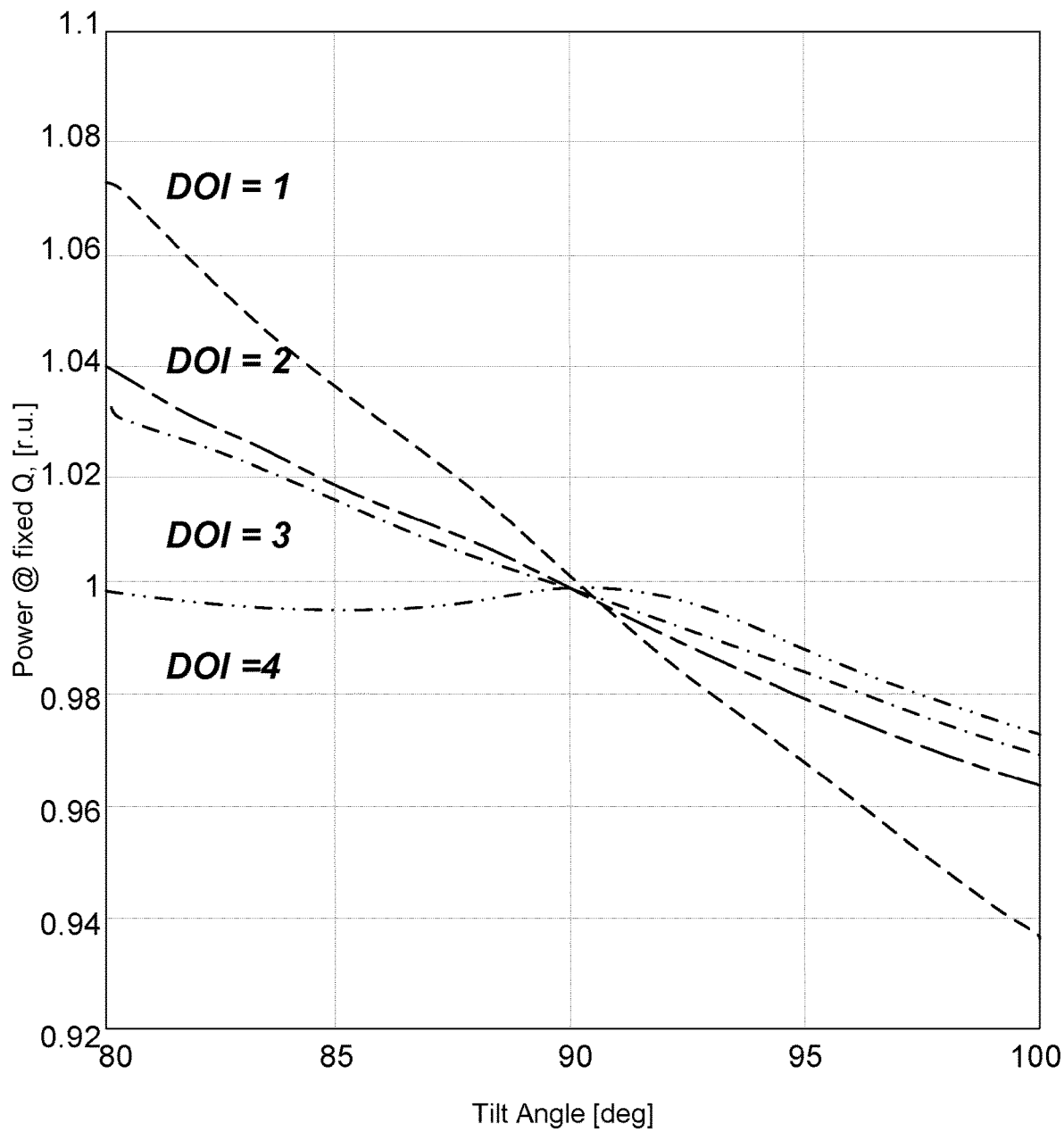
FIG. 9A depicts tool power consumption as a function of the azimuth angle. Transmitter power is plotted in relative units [r.u.] under condition of the fixed quality factor of the antenna, Q.

As described herein, the tilt angle has been defined relative to axis X. Excepting the perpendicular, the range of the tilt angle can be from 80°-100° and beyond (as most of the graphs in FIG. 7 are essentially linear, their extrapolation to 75° and 105° may suggest the same conclusions as those for the 80°-100° range). As disclosed herein, a tilt angle that is greater or less than perpendicular provides particular advantages. In some embodiments, the tilt angle is increased over perpendicular sufficiently to increase the gradients and/or the SNR obtained over that achieved with a perpendicular direction of magnetization. In some embodiments, the tilt angle is increased over perpendicular sufficiently in reduce the power required to under that required with a perpendicular direction of magnetization (FIG. 9A). For example, in some embodiments the tilt angle is increased over perpendicular sufficiently in reduce the power required to under that required with a perpendicular direction of magnetization by 3-5%. Thus, in some embodiments the tilt angle would be increased over perpendicular to a tilt angle of 92°-105°. In some embodiments, the tilt angle would be decreased to be less than perpendicular in order to decrease the $^1$H signal density from the borehole (FIG. 7B). Thus, in some embodiments (such as for example with large size boreholes), the tilt angle would be decreased over perpendicular to a tilt angle of 75°-88°.

The value of the tilt angle, is generally fixed by the physical placement of the magnets and their direction of magnetization. Depending on the requirements of the NMR system, determining the desired the tilt angle can be done virtually to emphasize parameters of the interest (as is shown in FIGS. 7-9).

Figure 8A:
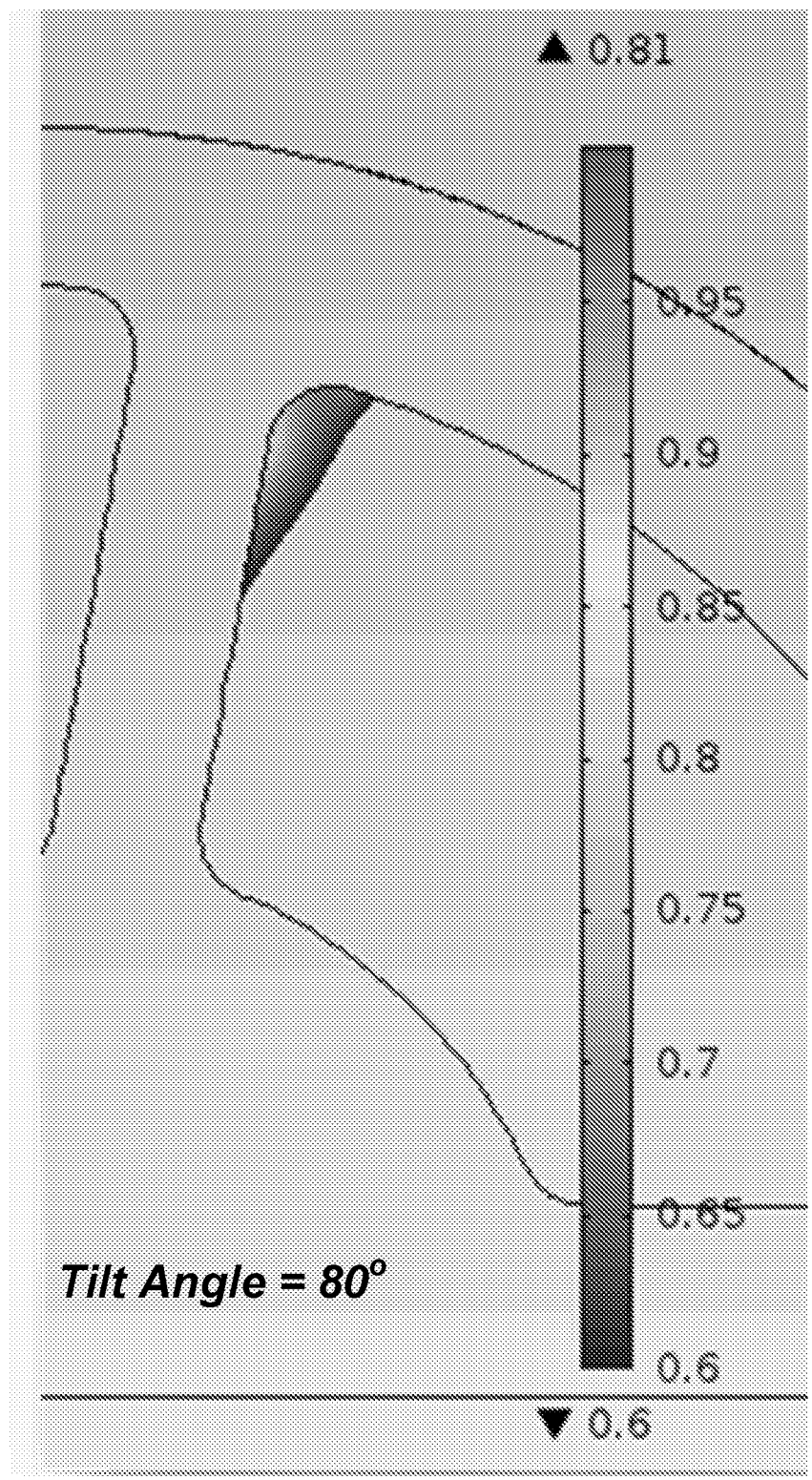
FIG. 8A-C depict magnetic field $B_0$ values within cores calculated for three representative values of the tilt angle. For FIG. 8A the tilt angle=80°. For FIG. 8B the tilt angle=90°. For FIG. 8C the tilt angle=100°.
Figure 8B:
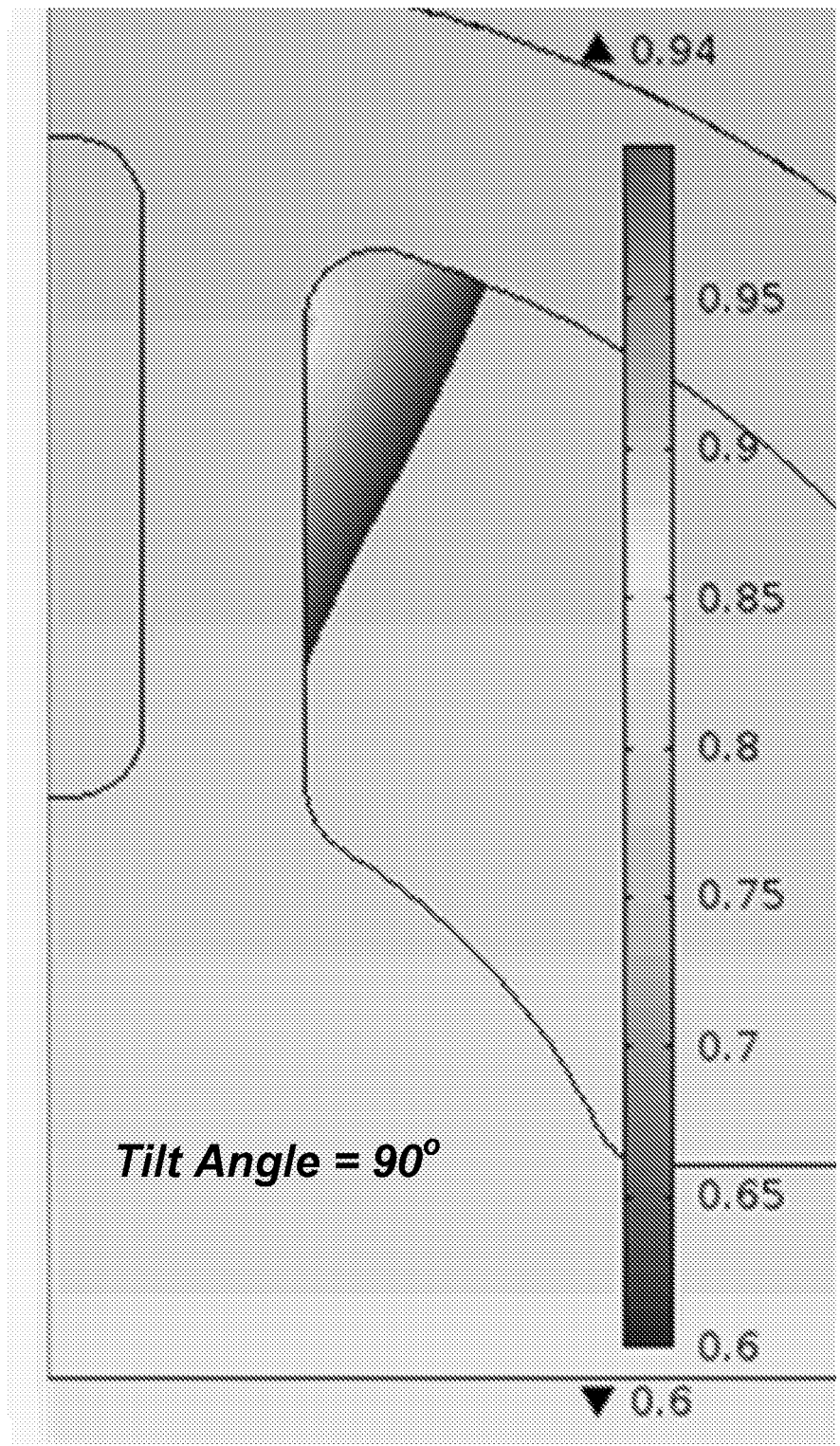
Figure 8C:
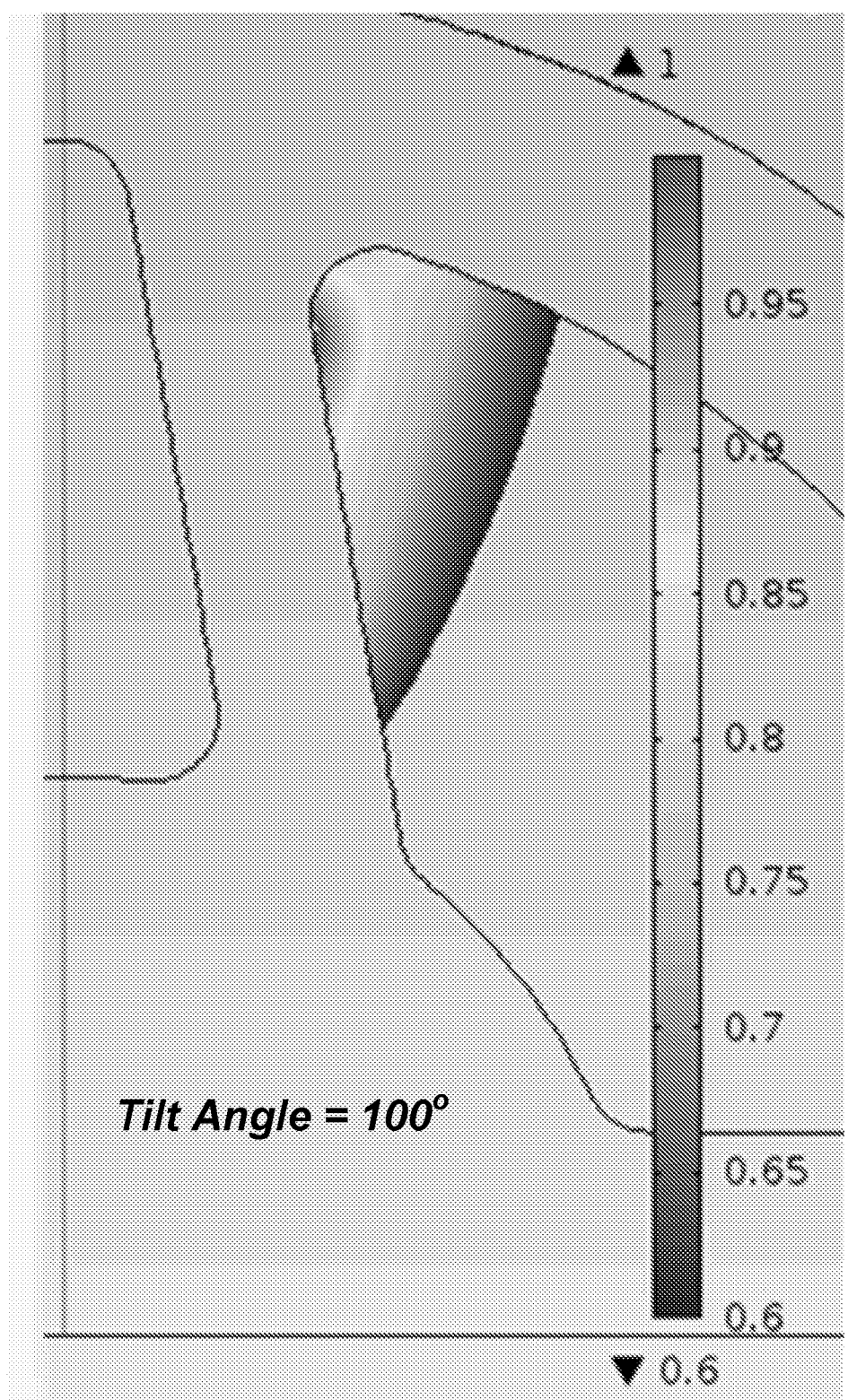

Practically, a tilt angle approximating 100° has certain advantages compared to a tilt angle of 90° or 80°. However, to control the $^1$H borehole signal the tilt angle can be limited (from its top values) by a value at which the $^1$H borehole signal does not exceed a predefined level (usually, a few [p.u.]). Considerations of core saturation may be implicated with large values of tilt angle. Practically, the core saturation is considered as a threat when, within the core, the field $B_0$ amplitude achieves values around 1[T] or more. FIGS. 8A-C address this issue. It is seen from FIG. 8C that a tilt angle of 100° or more may deliver undesired core saturation under certain conditions.

Figure 9B:
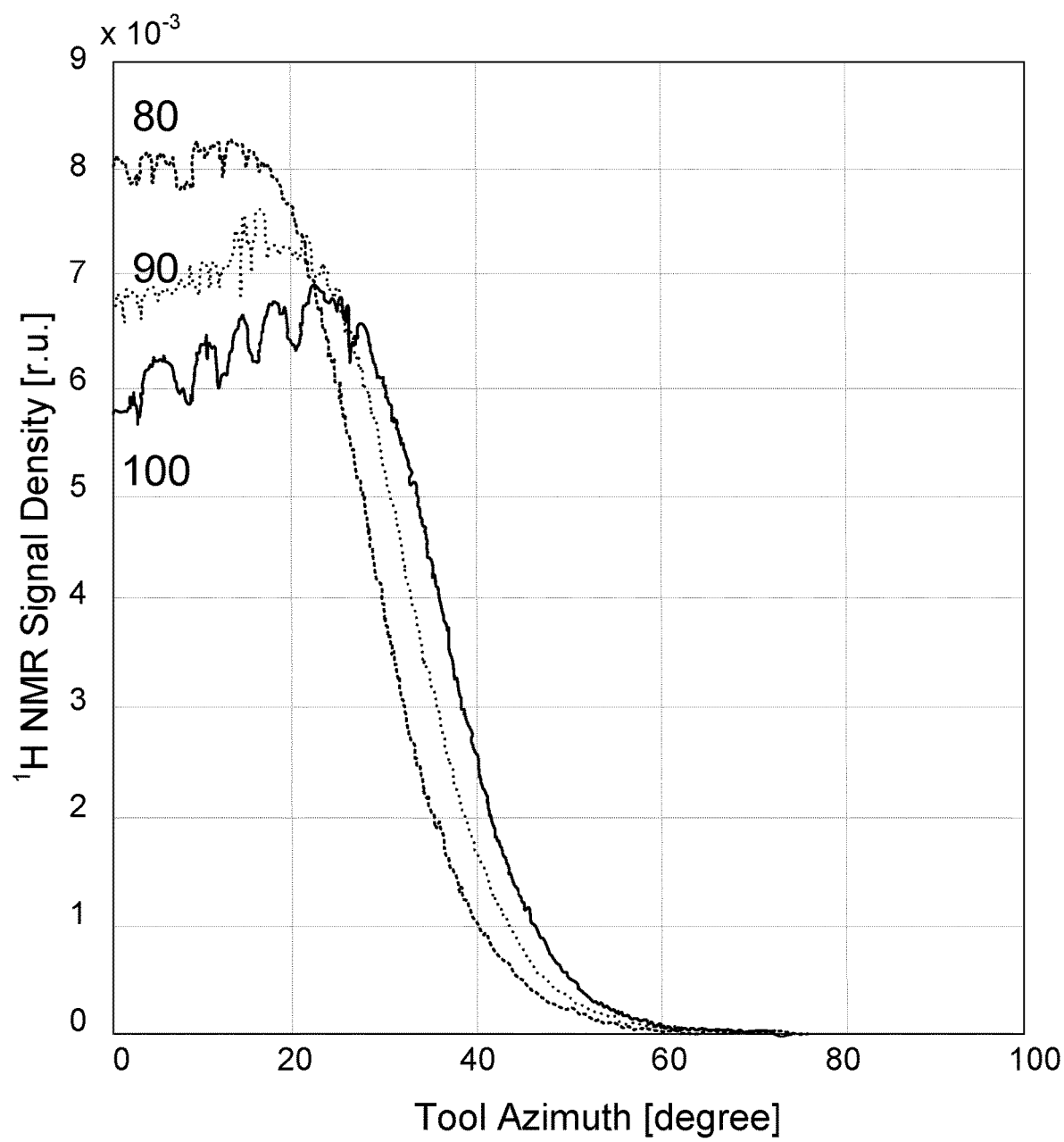
FIG. 9B depicts the $^1$H NMR signal density as a function of the azimuth angle.

The NMR signals from different parts of each Sensitive Volume may have different intensity. Accordingly, if desired the intensity may be presented as a function of the tool azimuth value, since all Sensitive Volumes have quasi cylindrical shape (see FIGS. 5A and B). FIG. 9B shows such a distribution for the closest Sensitive Volume, at DOI=1". Again, the curves are shown for three representative tilt angles. FIG. 9B shows that the entire $^1$H NMR signal can be sensed from an angular sector of ~60°. Moreover, the NMR beam is getting wider, with increase of the tilt angle. This provides the advantage of a richer gradient content of the NMR signal with the wider beam.

Another positive conclusion is derived from FIG. 9A, where the tool power consumption (P $\propto J^2$, where J is the antenna current in [A]) is presented as a function of the tilt angle. It is seen from the figure that the power consumption drops with increase the tilt angle, for all DOIs. Thus, FIGS. 9A and B demonstrate that one may enrich gradient content of the $^1$H NMR signal (in other words, to achieve higher values of involved gradients) by increasing the tilt angle $°\vartheta_{Tilt}$, and moreover, this would require even less energy.

FIG. 10 schematically depicts certain major elements of the electronics 70 including the T/R Switch 78 that switches the system between transmit and receive mode, the Transmitters 74 (which in the depicted embodiment includes Transmitters 1 and 2) electronically connected to Transmitter Filters 76, which generates the high power for the RF pulses generated by antennas 26 while in transmit mode. A Receiver (Low-Noise Amplifier, LNA) 80 amplifies signals received from the antennas 26 while in receive mode. The Controller 82 [which may include digital to analog convertors, memory (including as needed, SRAM, NVRAM, operating system, flash memory), digital signal processor (DSP) s, and digital input/outputs (DIG I/O)] manages the sequences, acquires data and communicates with the surface. The electronics are powered by Power Supplies 72, which includes both low voltage (LVPS) and high voltage power supplies (GDPS).

All publications, patents and patent applications cited herein are hereby incorporated by reference as if set forth in their entirety herein. While this invention has been described with reference to illustrative embodiments, this description is not intended to be construed in a limiting sense. Various modifications and combinations of illustrative embodiments, as well as other embodiments of the invention, will be apparent to persons skilled in the art upon reference to the description. It is therefore intended that the appended claims encompass such modifications and enhancements.

We claim:

1. A Nuclear Magnetic Resonance (NMR) sensor, comprising:
   a radio frequency (RF) antenna for generating an RF magnetic field $B_1$ and comprising an RF frame antenna and a pair of magnetically permeable antenna cores;
   a pair of permanent magnets for generating a static magnetic field $B_0$, wherein each permanent magnet in the pair has a different magnetization angle and the magnetization angles are non-parallel to each other; and
   a high conductivity screen encircling the permanent magnets and separating the permanent magnets from the pair of magnetically permeable antenna cores,
   wherein the magnetically permeable antenna cores and the high conductivity screen are configured to shape the RF magnetic field $B_1$ generated by the sensor.

2. The NMR sensor of claim 1, wherein each of the pair of permanent magnets are identical in shape.

3. The NMR sensor of claim 1, wherein the RF magnetic field $B_1$ generated is not substantially orthogonal to the direction of magnetization of either permanent magnet.

4. The NMR sensor of claim 1, wherein the pair of magnets comprise magnet $M^1$ and magnet $M^2$, wherein the magnetization angles of each satisfy:

$$M_x^1 = -M_x^2,\ M_y^1 = M_y^2,\ M_z^1 = Z_x^2 = 0, \quad \text{Eq. (2)}$$

wherein x and y are Cartesian space coordinates, and wherein magnetizations are driven by a tilt angle:

$${}^v\vartheta_{Tilt} = \frac{\pi}{2} - \mathrm{atan}\left(\frac{M_x}{M_y}\right). \quad \text{Eq. (3)}$$

5. The NMR sensor of claim 4, wherein the tilt angle ${}^o\vartheta_{Tilt}$ is selected from a non-perpendicular ${}^o\vartheta_{Tilt}$ in a range from 75° and 105°.

6. The NMR sensor of claim 4, wherein the tilt angle ${}^o\vartheta_{Tilt}$ is selected from the non-perpendicular ${}^o\vartheta_{Tilt}$ in a range from 80° and 100°.

7. The NMR sensor of claim , wherein the tilt angle ${}^o\vartheta_{Tilt}$ is selected from a range of 92°-105°.

8. The NMR sensor of claim 4, wherein the tilt angle ${}^o\vartheta_{Tilt}$ is an angle that is increased over perpendicular sufficiently to increase a gradient and/or a signal to noise ratio over that achieved with a perpendicular direction of magnetization.

9. The NMR sensor of claim 4, wherein the tilt angle ${}^o\vartheta_{Tilt}$ is an angle that is increased over perpendicular sufficiently to reduce a power consumption of the sensor to under that required with a perpendicular direction of magnetization.

10. The NMR sensor of claim 9, wherein the tilt angle ${}^o\vartheta_{Tilt}$ is an angle that is increased over perpendicular sufficiently to reduce an effective power required to under that required with a perpendicular direction of magnetization by 3-5%.

11. The NMR sensor of claim 4, wherein the tilt angle ${}^o\vartheta_{Tilt}$ is an angle that is decreased under perpendicular sufficiently to decrease a $^1$H borehole signal density to under that achieved with a perpendicular direction of magnetization.

12. The NMR sensor of claim 4, wherein the tilt angle ${}^o\vartheta_{Tilt}$ is selected from a range of 75°-88°.

13. A side-looking Nuclear Magnetic Resonance (NMR) downhole tool for use in a borehole under investigation, the tool comprising:
   an outer cylindrical housing adapted to eccentric placement in the borehole and having a front side that is adapted to closely approach a side of the borehole under investigation;
   a centrally located internal backbone running axially through at least a portion of the housing;
   a pair of mirror image elongated permanent magnets disposed axially within the housing and affixed to the backbone on a side of tool that is distal to the front side of the housing, each of the pair of permanent magnets having a different and non-parallel magnetization angle that is perpendicular to a longitudinal axis of the housing;
   a radio frequency (RF) antenna configured to generate an RF magnetic field $B_1$, the RF antenna comprising an RF frame antenna and a pair of magnetically permeable antenna cores affixed to the backbone on a side of tool that is proximal to the front side of the housing; and
   a high conductivity screen encircling the permanent magnets and separating the permanent magnets from the pair of magnetically permeable antenna cores, wherein the magnetically permeable antenna cores and the high conductivity screen are configured to shape the RF magnetic field $B_1$ generated by the sensor.

14. The side-looking NMR downhole tool of claim 13, wherein the RF magnetic field generated is not substantially orthogonal to a direction of magnetization of either permanent magnet.

15. The side-looking NMR downhole tool of claim 13, wherein the pair of mirror image elongated permanent magnets comprise magnet $M^1$ and magnet $M^2$, wherein the magnetization angles of each satisfy:

$$M_x^1 = -M_x^2,\ M_y^1 = M_y^2,\ M_x^1 = M_z^2 = 0, \quad \text{Eq. (1),}$$

wherein x and y are Cartesian space coordinates; and wherein the magnetizations are driven by a tilt angle:

$${}^v\vartheta_{Tilt} = \frac{\pi}{2} - \mathrm{atan}\left(\frac{M_x}{M_y}\right). \quad \text{Eq. (2)}$$

16. The side-looking NMR downhole tool of claim 15, wherein the tilt angle ${}^o\vartheta_{Tilt}$ is selected from a non-perpendicular ${}^o\vartheta_{Tilt}$ in a range from 75° and 105°.

17. The side-looking NMR downhole tool of claim 13, wherein a portion of the screen further separates the pair of magnetically permeable antenna cores from one another.

18. The side-looking NMR downhole tool of claim 13, wherein the screen is formed of a high electrical conductivity material selected from the group consisting of copper, aluminum, and silver.

19. The side-looking NMR downhole tool of claim 13, wherein the outer cylindrical housing is composed of a magnetically transparent material selected from the group consisting of fiberglass, plastic, and ceramic.

20. The side-looking NMR downhole tool of claim 13, wherein the backbone defines a conduit for one or more electrical wires through the tool.

* * * * *